(12) United States Patent
Lowrance et al.

(10) Patent No.: US 9,656,491 B1
(45) Date of Patent: May 23, 2017

(54) APPARATUS AND METHOD FOR CONTROL OF PRINT GAP

(71) Applicant: Kateeva, Inc., Newark, CA (US)

(72) Inventors: Robert B. Lowrance, San Jose, CA (US); Michael Miller, Sunnyvale, CA (US); Sass Somekh, Los Altos, CA (US); Conor F. Madigan, San Francisco, CA (US); Eliyahu Vronsky, Los Altos, CA (US); Manoocher Birang, Los Gatos, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/423,169

(22) Filed: Feb. 2, 2017

Related U.S. Application Data

(60) Continuation of application No. 15/385,803, filed on Dec. 20, 2016, which is a continuation of application No. 15/080,407, filed on Mar. 24, 2016, now Pat. No. 9,550,383, which is a continuation of application No. 14/807,628, filed on Jul. 23, 2015, now Pat. No. 9,302,513, which is a division of application No. 13/570,154, filed on Aug. 8, 2012, now Pat. No. 9,120,344.

(60) Provisional application No. 61/521,604, filed on Aug. 9, 2011.

(51) Int. Cl.
*B41J 25/308* (2006.01)
*G06K 15/10* (2006.01)

(52) U.S. Cl.
CPC .......... *B41J 25/308* (2013.01); *G06K 15/102* (2013.01)

(58) Field of Classification Search
CPC .................................................. B41J 25/308
See application file for complete search history.

(56) References Cited

U.S. PATENT DOCUMENTS

| | | | |
|---|---|---|---|
| 5,065,169 A | 11/1991 | Vincent et al. | |
| 5,896,154 A | 4/1999 | Mitani et al. | |
| 6,437,351 B1 | 8/2002 | Smick et al. | |
| 6,781,684 B1 | 8/2004 | Ekhoff | |

(Continued)

FOREIGN PATENT DOCUMENTS

| CN | 101088141 A | 12/2007 |
|---|---|---|
| CN | 101809193 A | 8/2010 |

(Continued)

OTHER PUBLICATIONS

Applicant-Initiated Interview Summary dated Aug. 15, 2013 for U.S. Appl. No. 13/551,209.

(Continued)

*Primary Examiner* — Julian Huffman

(57) ABSTRACT

Gas bearing systems, print gap control systems, and methods of print gap control are provided. The gas bearing systems can accommodate one or more print module packages. The systems and methods can be used for inkjet and/or thermal printing applications such as manufacturing organic light emitting devices (OLEDs). Gas bearing systems can employ one or more of pressurized gas and vacuum. For oxygen-sensitive applications, an inert gas, such as nitrogen gas, can be employed as the pressurized gas. Fluid channels and apertures of the gas bearing systems can be varied in terms of size and relative position to one another. Fluid channels and apertures can be grouped and paired with one or more manifolds and ultimately a pressurized gas and/or vacuum source.

15 Claims, 7 Drawing Sheets

(56) References Cited

U.S. PATENT DOCUMENTS

| | | |
|---|---|---|
| 7,258,768 B2 | 8/2007 | Yamazaki |
| 7,326,300 B2 | 2/2008 | Sun et al. |
| 7,530,778 B2 | 5/2009 | Yassour et al. |
| 7,703,911 B2 | 4/2010 | Chung et al. |
| 8,383,202 B2 | 2/2013 | Somekh et al. |
| 8,720,366 B2 | 5/2014 | Somekh et al. |
| 8,802,186 B2 | 8/2014 | Somekh et al. |
| 8,802,195 B2 | 8/2014 | Somekh et al. |
| 8,899,171 B2 | 12/2014 | Mauck et al. |
| 9,034,428 B2 | 5/2015 | Lowrance et al. |
| 9,048,344 B2 | 6/2015 | Mauck et al. |
| 9,120,344 B2 | 9/2015 | Lowrance et al. |
| 9,174,433 B2 | 11/2015 | Somekh et al. |
| 9,248,643 B2 | 2/2016 | Somekh et al. |
| 9,302,513 B2 | 4/2016 | Lowrance et al. |
| 9,387,709 B2 | 7/2016 | Mauck et al. |
| 9,550,383 B2 | 1/2017 | Lowrance et al. |
| 2002/0033860 A1 | 3/2002 | Kubota et al. |
| 2002/0079057 A1 | 6/2002 | Yoshioka et al. |
| 2003/0000476 A1 | 1/2003 | Matsunaga et al. |
| 2003/0175414 A1 | 9/2003 | Hayashi |
| 2004/0050325 A1 | 3/2004 | Samoilov et al. |
| 2004/0115339 A1 | 6/2004 | Ito |
| 2005/0005850 A1 | 1/2005 | Yamazaki |
| 2005/0040338 A1 | 2/2005 | Weiss et al. |
| 2005/0104945 A1 | 5/2005 | Chung et al. |
| 2005/0223994 A1 | 10/2005 | Blomiley et al. |
| 2006/0054774 A1 | 3/2006 | Yassour et al. |
| 2006/0236938 A1 | 10/2006 | Powell et al. |
| 2007/0044713 A1 | 3/2007 | Yasui et al. |
| 2008/0241587 A1 | 10/2008 | Ohmi et al. |
| 2009/0031579 A1 | 2/2009 | Piatt et al. |
| 2009/0078204 A1 | 3/2009 | Kerr et al. |
| 2009/0081885 A1 | 3/2009 | Levy et al. |
| 2010/0182359 A1 | 7/2010 | Kim et al. |
| 2010/0201749 A1 | 8/2010 | Somekh et al. |
| 2011/0043554 A1 | 2/2011 | Silverbrook et al. |
| 2012/0306951 A1 | 12/2012 | Somekh et al. |
| 2013/0164438 A1 | 6/2013 | Somekh et al. |
| 2013/0164439 A1 | 6/2013 | Somekh et al. |
| 2013/0209669 A1 | 8/2013 | Somekh et al. |
| 2013/0209670 A1 | 8/2013 | Somekh et al. |
| 2013/0209671 A1 | 8/2013 | Somekh et al. |
| 2013/0307898 A1 | 11/2013 | Somekh et al. |
| 2014/0311405 A1 | 10/2014 | Mauck et al. |
| 2015/0217581 A1 | 8/2015 | Lowrance et al. |
| 2015/0328910 A1 | 11/2015 | Lowrance et al. |
| 2016/0144621 A1 | 5/2016 | Lowrance et al. |

FOREIGN PATENT DOCUMENTS

| | | |
|---|---|---|
| CN | 102271922 A | 12/2011 |
| JP | 2011225355 A | 11/2011 |
| WO | 2012003440 A2 | 1/2012 |
| WO | 2013023099 A1 | 2/2013 |

OTHER PUBLICATIONS

Applicant-Initiated Interview Summary dated Oct. 19, 2012 for U.S. Appl. No. 12/652,040.
Corrected Notice of Allowance issued on Mar. 4, 2016, to U.S. Appl. No. 14/807,628.
Corrected Notice of Allowance issued on Sep. 22, 2015 to U.S. Pat. No. 4,688,920.
Final Office Action issued on Jun. 10, 2014, to U.S. Appl. No. 13/773,649.
Final Office Action issued on Jun. 12, 2014, to U.S. Appl. No. 13/773,643.
Final Office Action issued on Nov. 8, 2013, to U.S. Appl. No. 13/551,209.
Final Office Action mailed on Jun. 18, 2014, for U.S. Appl. No. 13/774,577.
First Office Action issued to Chinese Patent Application No. 201280038614.8, on Aug. 18, 2015.
Forrest, Stephen R., "The Path to Ubiquitous and Low-cost Organic Electronic Appliances on Plastic," Nature, Apr. 29, 2004, vol. 428, 8 pages.
International Search Report and Written Opinion issued on Jan. 17, 2013 to PCT Application PCT/US12/050207.
International Search Report and Written Opinion issued on Mar. 11, 2014, to PCT Application PCT/US13/063128.
Non-Final Office Action issued on Apr. 15, 2015, to U.S. Appl. No. 13/776,602.
Non-Final Office Action issued on Apr. 17, 2015, to U.S. Appl. No. 13/774,693.
Non-Final Office Action issued on Dec. 30, 2016 for U.S. Appl. No. 14/925,003.
Non-Final Office Action issued on Dec. 31, 2013, to U.S. Appl. No. 13/774,577.
Non-Final Office Action issued on Feb. 28, 2014, to U.S. Appl. No. 13/773,649.
Non-Final Office Action issued on Feb. 17, 2017 for U.S. Appl. No. 15/409,844.
Non-Final Office Action issued on Feb. 7, 2014, to U.S. Appl. No. 13/773,643.
Non-Final Office Action issued on Jan. 17, 2017 for U.S. Appl. No. 14/996,086.
Non-Final Office Action issued on Jun. 14, 2012, to U.S. Appl. No. 12/652,040.
Non-Final Office Action issued to U.S. Appl. No. 13/551,209, on Apr. 24, 2013.
Non-Final Office Action issued to U.S. Appl. No. 13/571,166 on Oct. 8, 2014.
Non-Final Office Action mailed on Jul. 1, 2014, for U.S. Appl. No. 13/773,654.
Notice of Allowance issued on Dec. 7, 2012 to U.S. Appl. No. 12/652,040.
Notice of Allowance issued on Feb. 20, 2014, to U.S. Appl. No. 13/551,209.
Notice of Allowance issued on Jan. 29, 2016, to U.S. Appl. No. 14/807,628.
Notice of Allowance issued on Jul. 2, 2014, to U.S. Appl. No. 13/774,577.
Notice of Allowance issued on Jul. 1, 2014, to U.S. Appl. No. 13/773,649.
Notice of Allowance issued on Jul. 17, 2015 for U.S. Appl. No. 13/570,154.
Notice of Allowance issued on Jun. 30, 2014, to U.S. Appl. No. 13/773,641.
Notice of Allowance issued on Mar. 2, 2015 for U.S. Appl. No. 13/571,166.
Notice of Allowance issued on Nov. 19, 2015, to U.S. Appl. No. 13/776,602.
Notice of Allowance issued on Sep. 9, 2015, to U.S. Appl. No. 13/774,693.
Notice of Allowance issued to U.S. Appl. No. 13/570,154 on Jul. 17, 2015.
Notice of Allowance issued to U.S. Appl. No. 14/688,920 on Aug. 24, 2015.
Notice of Allowance mailed on Sep. 29, 2014, to U.S. Appl. No. 13/773,654.
Notification of Provisional Rejection issued on Aug. 22, 2016, to KR Patent Application No. 10-2015-7003107.
Notification of Provisional Rejection issued on Mar. 24, 2016 to KR Patent Application 10-2014-7005405.
Notification of Second Provisional Rejection issued on Aug. 30, 2016 to KR Patent Application No. 10-2014-7005405.
Office Action issued on Jan. 15, 2016 to JP Patent Application No. 2014-525155.
Office Action issued on Jan. 28, 2016, to JP Patent Application 2015-526775.
Office Action issued on Jun. 23, 2016, to CN Patent Application 201380052559.2.
Office Action issued to JP Patent Application 2015-526775 on Jan. 28, 2016.

(56) References Cited

OTHER PUBLICATIONS

Second Office Action issued on Mar. 2, 2017, to CN Patent Application 201380052559.2.
Street et al., "Jet Printing of Active-Matrix TFT Backplanes for Displays and Sensors", IS&T Archiving, Dec. 2005, vol. 20, No. 5, 16 pages.
Second Office Action issued to Chinese Patent Application No. 201280038614.8, on Feb. 1, 2016.

APPARATUS AND METHOD FOR CONTROL OF PRINT GAP

RELATED APPLICATIONS

The present application is a continuation case of U.S. application Ser. No. 15/385,803, filed Dec. 20, 2016. U.S. application Ser. No. 15/385,803 is a continuation case of U.S. application Ser. No. 15/080,407, filed Mar. 24, 2016, which issued as U.S. Pat. No. 9,550,383 on Jan. 24, 2017. U.S. Pat. No. 9,550,383 is a continuation case of U.S. application Ser. No. 14/807,628 filed Jul. 23, 2015, which issued as U.S. Pat. No. 9,302,513 on Apr. 5, 2016. U.S. Pat. No. 9,302,513 is a divisional application of U.S. application Ser. No. 13/570,154, filed Aug. 8, 2012, which issued as U.S. Pat. No. 9,120,344 on Sep. 1, 2015. U.S. Pat. No. 9,120,344 claims the benefit of U.S. Provisional Patent Application No. 61/521,604, filed Aug. 9, 2011. All related applications cited in this section are incorporated herein by reference in their entirety.

FIELD

The present teachings relate to thin-film printing apparatuses and methods.

BACKGROUND

In a variety of circumstances, it can be beneficial for a printhead to maintain a tightly controlled gap between its transfer surface, or discharge nozzle, and a substrate surface on which the printhead is to print a material. Such control is especially important in printing with a thermal printing printhead devised for deposition of a dry ink without contacting the surface on which the dry ink is to be deposited. If the printhead is too far away from the substrate surface, the printing can be too diffuse. If the printhead is too close to the substrate surface, printing can be too granular. When too close, the printhead may even contact the substrate, resulting in damage to both the substrate and the printhead. Gap control is also important in inkjet printing between the inkjet printhead and a substrate. Therefore, it is desirable to control the print gap between the substrate and the printhead in both thermal and inkjet printing systems, to optimize printing results and the printing process.

SUMMARY

According to various embodiments, the present teachings relate to a gas bearing system that can be used for holding a printhead and print module package and for maintaining a tightly controlled gap between the transfer surface of the printhead and a substrate onto which a material is to be printed. The system comprises a housing having a sidewall that has an exterior surface and an interior surface. The sidewall defines an interior cavity configured to receive a print module package. The interior surface can terminate at an opening to the interior cavity. The sidewall can also have an end surface between its exterior surface and its interior surface, and the end surface can comprise a first plurality of apertures and a second plurality of apertures. A first plurality of fluid channels can be included in the sidewall and can extend from the first plurality of apertures, into the sidewall and into fluid communication with a first manifold. The first manifold can be internal to the sidewall, external, or both. A second plurality of fluid channels can be included in the sidewall and can extend from the second plurality of apertures, into the sidewall, and into fluid communication with a second manifold. The second manifold can be internal to the sidewall, external, or both. The first manifold can be in fluid communication with an environment outside of the housing, for example, via a first port. The second manifold can be in fluid communication with an environment outside of the housing, for example, via a second port.

According to various embodiments, a print gap control system is provided that comprises a gas bearing system as described herein, and a substrate comprising a first planar surface. The system can be configured such that an end surface of the gas bearing lies in a first plane, at least one inkjet printhead or at least one transfer surface of a thermal printing printhead lies in a second plane, and the first planar surface of the substrate lies in a third plane. The first, second, and third planes can be substantially parallel to one another. A gas bearing gap can be defined by a distance between the first plane and the third plane. A print gap can be defined by a distance between the second plane and the third plane. At least one of the end surface, the transfer surface, and the first planar substrate surface of the substrate can be adjustable to control a size of the print gap, a size of the gas bearing gap, or both. It is to be understood that in some embodiments the print gap can be controlled by controlling the gas bearing gap.

According to various embodiments of the present teachings, a method is provided that comprises positioning a print module package with respect to a substrate and printing a material onto the substrate by using the print module package. The positioning can be accomplished with a gas bearing system as described herein, for example, a system comprising a housing wherein the housing comprises a sidewall that defines an interior cavity. The sidewall can have an exterior surface and an interior surface and the print module package can be received within the interior cavity. The interior surface can terminate at an opening to the interior cavity. The method can comprise mounting a print module package in the interior cavity. The sidewall can further have an end surface between the exterior surface and the interior surface, and the end surface can comprise a first plurality of apertures and a second plurality of apertures. The sidewall can further comprise a first plurality of fluid channels extending from the first plurality of apertures into the sidewall and communicating with a first manifold and the method can comprise supplying a pressurized gas source to the first manifold and from the first manifold to the first plurality of fluid channels. In addition, the sidewall can comprise a second plurality of fluid channels extending from the second plurality of apertures into the sidewall and communicating with a second manifold and the method can comprise causing a vacuum from the second manifold to a source of vacuum and from the second plurality of fluid channels to the second manifold. The first manifold can be in fluid communication with an environment outside of the housing, for example, via a first port, and the second manifold can be in fluid communication with an environment outside of the housing, for example, via a second port. The method can comprise using a combination of pressurized gas and vacuum, to and from the first and second pluralities of apertures, to control a print gap.

BRIEF DESCRIPTION OF THE DRAWINGS

A better understanding of the features and advantages of the present disclosure will be obtained by reference to the accompanying drawings, which are intended to illustrate, not limit, the present teachings.

DETAILED DESCRIPTION OF THE DISCLOSURE

Figure 1:
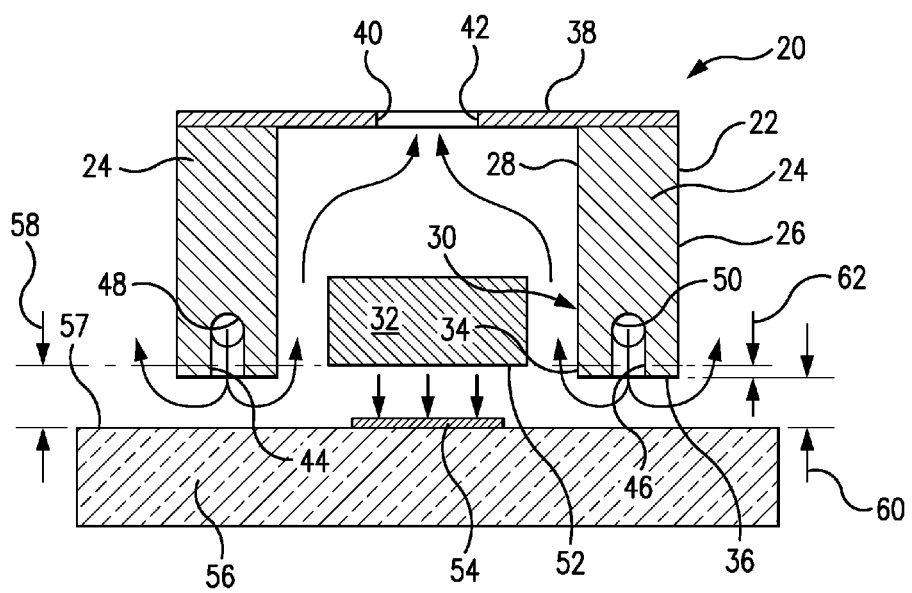
FIG. 1 is a cross-sectional side view of a gas bearing system, a print module package positioned therein, a substrate to be printed on, and a substrate support, in accordance with various embodiments of the present teachings.

According to various embodiments of the present teachings, the gas bearing system comprises a housing having a sidewall and the sidewall comprises an exterior surface and an interior surface. The sidewall defines an interior cavity configured to receive a print module package. The interior surface can terminate at a top, a bottom, or both, and define an opening to the interior cavity. The interior cavity can form a through-hole through the housing or can have only a single opening at one end. The sidewall can also have an end surface between its exterior surface and its interior surface, and the end surface can comprise a first plurality of apertures and a second plurality of apertures. A first plurality of fluid channels can be included in the sidewall and can extend from the first plurality of apertures, into the sidewall, and into fluid communication with a first manifold. A second plurality of fluid channels can be included in the sidewall and can extend from the second plurality of apertures, into the sidewall, and into fluid communication with a second manifold. Each of the first manifold and the second manifold can independently be internal to the sidewall, external to the sidewall, or both. The first manifold can be in fluid communication with an environment outside of the housing, for example, via a first port. The second manifold can be in fluid communication with an environment outside of the housing, for example, via a second port. Conduits, such as tubing, can be in fluid communication with each of the manifolds and can be further connected to a supply of pressurized gas, to a vacuum source, or both. The first plurality of apertures and the second plurality of apertures can be arranged to surround the opening to the interior cavity. The interior cavity can have a cross-sectional shape that is square, rectangular, round, or of any other shape. The apertures can surround the opening to the interior cavity on two sides, three sides, four sides, or at least five sides.

In some embodiments, the end surface of the sidewall can further comprise a third plurality of fluid channels extending into the sidewall and communicating with a third manifold that differs from the first and second manifolds. The third manifold can be in fluid communication with an environment outside of the housing, for example, via a third port. The third manifold can be in fluid communication with a source of pressurized gas, a vacuum source, or both. The third manifold can be in fluid communication with the same source of pressurized gas that is in fluid communication with the first manifold, or in fluid communication with a different source of pressurized gas. The individual apertures of the first and second pluralities of apertures can be spaced apart from adjacent apertures by a mean distance of from about 0.5 mm to about 20 mm, for example, a mean distance of from about 1.0 mm to about 10 mm, of from about 2.0 mm to about 8.0 mm, or of from about 3.0 mm to about 6.0 mm. The apertures of the first and second pluralities of apertures can have a mean diameter of from about 0.001 inch to about 0.1 inch, for example, of from about 0.003 inch to about 0.075 inch, of from about 0.005 inch to about 0.05 inch, or of from about 0.01 inch to about 0.04 inch. In some embodiments, the first plurality of apertures can have a mean diameter of from about 0.005 inch to about 0.025 inch and the second plurality of apertures can have a mean diameter of from about 0.030 inch to about 0.090 inch.

According to various embodiments, the first plurality of fluid channels can be in fluid communication with a pressurized gas source and the second plurality of fluid channels can be in fluid communication with a vacuum source. The pressurized gas source can comprise a pressurized inert gas source, for example, a source of nitrogen gas, a source of a noble gas, or a combination thereof.

In some embodiments, the housing can comprise a plurality of components, for example, a base plate, a manifold compartment mounted on the base plate, and a face plate mounted on the manifold. In an exemplary configuration, the face plate comprises the end surface. The base plate can comprise the first and second ports and the manifold compartment can comprise the first and second manifolds. In some embodiments, the base plate comprises a third port and the manifold compartment comprises a third manifold. In some embodiments, the base plate can comprise first, second, and third ports and the manifold compartment can comprise first, second, and third manifolds. In some embodiments, the manifold compartment or one or more of the manifolds can comprise one or more of the ports. A connector flange can be connected to the base plate and configured for connection to at least one of a support and an actuator. One or more of the components can define the sidewall or partially define the sidewall, for example, a stack of components including a face plate can together define the sidewall, the interior cavity, or both.

In some embodiments, the housing can provide a second opening to the interior cavity. The second opening can be located opposite the first opening such that the interior cavity can comprise a through hole that extends through the entire housing. At least one print module package can be mounted in the interior cavity. In some cases, the at least one print module package can comprise at least one inkjet printhead or at least one thermal printing printhead having at least one transfer surface, and at least one heater in thermal communication with the at least one transfer surface. In some embodiments, the second opening allows exhaust to be vented from the interior cavity. The second opening can enable print module package loading from a top of the system, from a bottom of the system, or both. It is understood that the orientation of the gas bearing system can be varied and that designations such at top and bottom are intended to be relative and not absolute terms. In some embodiments, the features are reversed such that the second opening can enable the print module package to be loaded from a bottom of the system.

According to various embodiments, a print gap control system is provided that comprises a gas bearing system as described herein, and a substrate comprising a first planar surface. The system can be configured such that the end surface lies in a first plane, the at least one transfer surface lies in a second plane, and the first planar substrate surface lies in a third plane. The first, second, and third planes can be substantially parallel to one another, that is, parallel to one another or skewed by less than 10° or less than 5° with respect to each other. A gas bearing gap can be defined by a distance between the first plane and the third plane. A print gap can be defined by a distance between the second plane and the third plane. At least one of the end surface, the inkjet printhead or transfer surface, and the first planar substrate surface can be adjustable to control a size of the print gap, a size of the gas bearing gap, or both. The print gap can be controlled independently and/or by controlling the size of the gas bearing gap. A gas bearing system can be positioned above, below, or above and below the substrate. The gas bearing system can comprise or be operably associated with one or more actuators to enable adjustment of the position of the gas bearing system relative to the substrate and/or relative to one or more inkjet printheads.

A second gas bearing system can be provided facing the first gas bearing system such that the substrate is positioned between the first gas bearing system and the second gas bearing system. The second gas bearing system can also comprise a plurality of pressurized gas channels and optionally a plurality of vacuum channels. Pressurized gas channels and vacuum channels can be arranged in any desired configuration. In some embodiments, every other fluid channel or alternating fluid channels comprise a pressurized channel and a vacuum channel. The second gas bearing, which can be mounted in a chuck, can provide temperature control for the substrate. That is, in addition to providing a force to the substrate, the second gas bearing can transfer heat to and/or from the substrate to achieve heating and/or cooling of the substrate. Such thermal control can be advantageous compared to direct contact with a heating element, for example, a heated chuck. Heating channels and cooling channels can be arranged in any desired configuration. In some embodiments, every other fluid channel can comprise a heating channel or a cooling channel. In some embodiments, alternating fluid channels comprise a heating channel, a cooling channel, a heating channel, a cooling channel, and so on. Thermal control can also be used to control the size of the substrate as heat can tend to expand the substrate and cooling can tend to contract the substrate. Maintenance of a constant size is advantageous. Thermal size changes can be particularly significant for larger substrates, for example, thermal size changes are significant for Generation 8 size glass (2.2 m by 2.5 m). Uncontrolled thermal change of the substrate can deleteriously affect product quality by shifting, horizontally and/or vertically, the deposition of ink on the substrate. In some embodiments, the print gap can have a tolerance of about +/−10 µm, +/−7 µm, or +/−5 µm.

According to various embodiments of the present teachings, a method is provided that comprises positioning a print module package with respect to a substrate and printing a material onto the substrate by using the print module package. The positioning can be accomplished with a gas bearing system as described herein, for example, one comprising a housing wherein the housing defines an interior cavity. The sidewall can have an exterior surface and an interior surface and the print module package can be received within the interior cavity. The interior surface can terminate at an opening to the interior cavity and the method can comprise mounting the print module package in the interior cavity. The sidewall can further have an end surface between the exterior surface and the interior surface, and the end surface can comprise a first plurality of apertures and a second plurality of apertures. The method can comprise supplying pressurized gas to and through the first plurality of apertures and drawing a vacuum through the second plurality of apertures. The sidewall can further comprise a first plurality of fluid channels extending from the first plurality of apertures into the sidewall and communicating with a first manifold. In addition, the sidewall can comprise a second plurality of fluid channels extending from the second plurality of apertures into the sidewall and communicating with a second manifold. The method can comprise supplying a pressurized gas to the first manifold and drawing a vacuum on the second manifold. The first manifold can be in fluid communication with an environment outside of the housing, for example, via a first port, and the second manifold can be in fluid communication with an environment outside of the housing, for example, via a second port. Tubing, piping, or other conduits can connect the first and second manifolds with sources of pressurized gas and vacuum, respectively. In some embodiments, the first plurality of apertures and the second plurality of apertures surround the opening to the interior cavity.

In some embodiments, the printing can comprise thermal printing, for example, thermal printing that comprises inkjet printing followed by solids transfer printing by sublimation or evaporation of solids using the print module package. Examples of thermal printing and print module packages that can be used in accordance with the present teachings include those described, for example, in U.S. Patent Application Publications Nos. US 2008/0308307 A1, US 2008/0311307 A1, US 2008/0311289 A1, and US 2006/0115585 A1, which are incorporated herein in their entireties by reference. The print module package can comprise a printhead transfer surface and/or inkjet nozzle orifice, the substrate can comprise a first surface, and the printhead transfer surface and/or the inkjet nozzle orifice can face the substrate first surface and be spaced apart from one another by a print gap. The printhead transfer surface can receive ink deposited by inkjet printing, for example, from an inkjet printing subsystem. In some embodiments, one or more printhead transfer surfaces are rotated to receive ink and/or rotated to face the substrate to be printed. In some embodiments, one or more inkjet printheads are rotated to transfer ink to one or more printhead transfer surfaces. The gas bearing system and/or printhead transfer surface can be positioned above, below, or above and below the substrate during printing. In some embodiments, the printing can comprise inkjet printing directly to a substrate. In such embodiments, the print module package can comprise an inkjet printhead. For example, the print module package can comprise a SAMBA printhead module (FUJIFILM Dimatix, Inc., Santa Clara, Calif.). The gas bearing system and/or inkjet printhead can be positioned above, below, or above and below the substrate during printing.

The positioning of the gas bearing system relative to the substrate can comprise controlling the size of the print gap by controlling a flow of fluid through at least one of the first and second manifolds. In some embodiments, the positioning can comprise maintaining a positive flow of fluid from the first manifold and through the first plurality of fluid channels and maintaining a negative flow of fluid into the second plurality of fluid channels and through the second manifold. The positioning can comprise adjusting the flow of pressurized gas, vacuum, or both, to control the size of the print gap, gas bearing gap, or both. A control unit can be used to effect control of a pressurized gas source, a vacuum source, or both.

In some embodiments, the print gap can be defined as a distance of from about 5 μm to about 100 μm, for example, from about 20 μm to about 30 μm, or about 25 μm. The method can maintain or provide a print gap by, for example, flowing an inert gas at a pressure of from about 10 psig to about 200 psig, from about 30 psig to about 90 psig, from about 50 psig to about 70 psig, or about 60 psig, through the first plurality of fluid channels. The positioning can further comprise pulling a vacuum through the second plurality of fluid channels at a negative pressure of from about −3.0 psig to about −13 psig, from about −5.0 psig to about −10 psig, or about −7.5 psig. In some cases, the printing can comprise printing onto a first surface of a substrate, wherein the substrate has a second surface opposite the first surface, and the method further comprises positioning a second gas bearing system adjacent the second surface of the substrate and opposite the first gas bearing system. The second gas bearing system can be configured to position the first surface of the substrate and to maintain a desired print gap. The second gas bearing system can be used instead of, or in addition to, the first gas bearing system.

Various embodiments of the present teachings relate to apparatuses and methods for using air bearings for maintaining and controlling print gap and for controlling the environment surrounding the ink deposition-printing process. For example, ink deposition can be carried out in a non-oxidizing environment. In some embodiments, the printhead is mounted in a gas bearing housing so that the set gap is fixed at a certain distance, which can be as close to zero mm as practical. The set gap corresponds to the distance between the transfer surface of the printhead and the end surface of the gas bearing housing. The gas bearing gap is the distance between the end surface and the substrate. Whether the substrate moves under the printhead and/or the printhead moves over the substrate, either way, there is relative motion between the printhead and the substrate. By pressurizing the fluid passageways of the gas bearing housing, gas flows out the openings in the housing and maintains the gas bearing gap between the gas bearing housing end surface and the substrate. By this means, the print gap becomes the sum of the gas bearing gap and the set gas such that the print gap is controlled by these other two gaps. Fine changes, for example, on the order of microns, can be made to the print gap by changing the gas pressure in the gas bearing housing. The flow of gas from the gas bearing housing to the exhaust creates an environment filled with the bearing gas. If the ink is sensitive to oxygen gas, a non-oxygen gas and/or inert gas such as nitrogen gas, for example, can be used to provide a non-oxidizing environment. The process of evaporating liquid ink within or on the printhead can cause solvent vapors to be produced. The exhaust opening allows both the removal of nitrogen gas injected by the gas bearing system and the removal of the solvent vapors evolved during evaporation of liquid ink.

In some embodiments, pressure and vacuum sources are both employed in defining a desired print gap. In some embodiments, a vacuum source and a nitrogen gas pressure source are provided. These sources are disposed for fluid communication with respective channels in a gas bearing housing, for example, disposed about a printhead, and thus a gas bearing gap can be established. The print gap can be variable relative to the bearing housing. The gas bearing housing and printhead can be disposed adjacent a substrate, for example, glass. The printhead can deposit film material, for example, an ink, comprising a film-forming material dissolved or suspended in a carrier fluid, on the substrate. In some embodiments, the substrate is supported via a chuck with a gas lift or gas bearing system. In some embodiments, the substrate is supported via a vacuum chuck in contact with the substrate.

As mentioned above, the gas bearing system of the present teachings can be used alone or in combination with one or more additional gas bearing systems. The additional gas bearing system can utilize any gas or mixture of gasses. The additional gas bearing system can use the same or different gas or gaseous mixture as contained in a gas enclosure system, for example, a system that encloses a thermal printing operation. In some embodiments, air bearings use an inert gas, for example, nitrogen gas, one or more noble gasses, or a combination thereof. Gas bearing systems, as well as related methods and systems, that can be used include those available from New Way Machine Components, Inc. of Aston, Pa. They can be used alone, or in combination with, the gas bearing systems described in the present teachings. Devices, systems, methods, and applications for use relating to gas bearing systems can be used in connection with the present teachings, including, for example, those described in U.S. Pat. No. 7,908,885 B2, which is incorporated herein in its entirety by reference. Gas bearing systems, as well as related methods and systems available from Coreflow Scientific Solutions LTD. of Yoqneam, Israel, can also be used, alone or in combination with the gas bearing systems described in the present teachings. Devices, systems, methods, and applications relating to gas bearing systems that can also be used in connection with the present teachings include, for example, those described in U.S. Pat. Nos. U.S. Pat. No. 7,857,121 B2, U.S. Pat. No. 7,604,439 B2, U.S. Pat. No. 7,603,028 B2, and U.S. Pat. No. 7,530,778 B2, which are incorporated herein in their entireties by reference.

Aspects of the present teachings can be practiced, for example, in connection with the teachings of U.S. Patent Application Publication Nos. US 2008/0311307 A1, US 2008/0311289 A1, US 2006/0115585 A1, US2010/0188457 A1, US 2011/0008541 A1, US 2010/0171780 A1, and US 2010/0201749 A1, and U.S. Patent Application No. 61/521,631 entitled "Face-Down Thermal-Jet Printing Apparatus and Methods," which are incorporated herein in their entireties by reference.

FIG. 1 is a cross-sectional view of a gas bearing system 20 in accordance with various embodiments of the present teachings. Gas bearing system 20 comprises a housing 22 that comprises a sidewall 24. Sidewall 24 comprises an exterior surface 26 and an interior surface 28. Interior surface 28 defines an interior cavity 30 that is configured to receive a print module package 32. Interior surface 28 terminates at a cavity opening 34 of interior cavity 30. An end surface 36 is disposed between interior surface 28 and exterior surface 26. Opposite end surface 36 is an annular end portion 38 comprising a second cavity opening 40. Second cavity opening 40 can comprise a through hole 42. A first aperture 44 and a second aperture 46 can be located on end surface 36. Extending from first aperture 44 can be a first fluid channel 48 that extends into sidewall 24 of housing 22. A second fluid channel 50 can extend from second aperture 46 into sidewall 24 of housing 22.

As seen in FIG. 1, print module package 32 can comprise a transfer surface 52 from which material can be transferred onto a substrate 56, and more specifically substrate surface 57, to form a deposited material 54. A print gap 58 is defined as the distance between transfer surface 52 and substrate surface 57. A gas bearing gap 60 is defined as the distance between end surface 36 and substrate surface 57. A set gap 62 is defined as the difference between the gas bearing system gap 60 and print gap 58, which is the same as the distance between transfer surface 52 and end surface 36.

Figure 2:
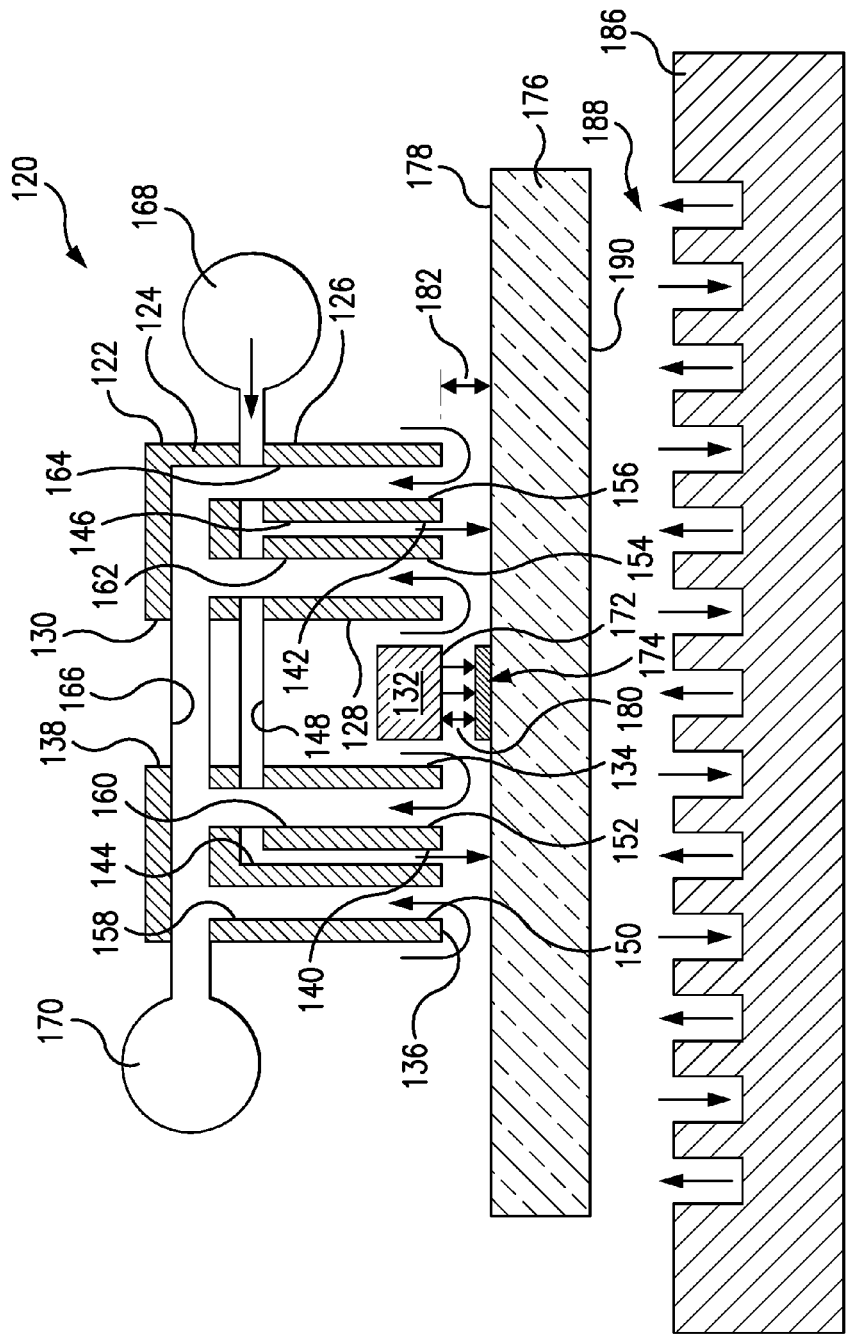
FIG. 2 is a cross-sectional side view of a gas bearing system, print module package positioned therein, substrate, and substrate positioning system, in accordance with various embodiments of the present teachings.

FIG. 2 is a schematic, cross-sectional view of a gas bearing system 120 in accordance with various embodiments of the present teachings. Gas bearing system 120 comprises a housing 122 that in turn comprises a sidewall 124. Sidewall 124 comprises an exterior surface 126 and an interior surface 128 defining an interior cavity 130. Interior cavity 130 is configured to receive a print module package 132 through a cavity opening 134. Between exterior surface 126 and interior surface 128 is an end surface 136. A second cavity opening 138 can be located opposite cavity opening 134. End surface 136 can comprise a first aperture 140 and a second aperture 142. A first fluid channel 144 can extend from first aperture 140 into sidewall 124 of housing 122. A second fluid channel 146 can extend from second aperture 142 into sidewall 124 of housing 122.

As seen in FIG. 2, first fluid channel 144 and second fluid channel 146 can be in fluid communication with a first manifold 148. End surface 136 can further comprise a third aperture 150, a fourth aperture 152, a fifth aperture 154, and a sixth aperture 156. Third fluid channel 158, fourth fluid channel 160, fifth fluid channel 162, and sixth fluid channel 164 can extend respectively from third aperture 150, fourth aperture 152, fifth aperture 154, and sixth aperture 156 into sidewall 124 of housing 122. Third fluid channel 158, fourth fluid channel 160, fifth fluid channel 162, and sixth fluid channel 164 can be in fluid communication with a second manifold 166. In some embodiments, a pressurized gas source 168 is in fluid communication with first manifold 148. In some embodiments, a vacuum source 170 is in fluid communication with second manifold 166. A transfer surface 172 of print module package 132 can be configured to deposit a material, for example, a film-forming material, on a substrate. Deposited material 174 can be located on substrate 176 and more specifically on substrate surface 178. A print gap 180 can be defined as the distance between transfer surface 172 and substrate surface 178. A gas bearing system gap can be defined as the distance between end surface 136 and substrate surface 178. A set gap can be defined as the distance between end surface 136 and transfer surface 172. In some embodiments, a second gas bearing system 186 is provided. Second gas bearing system 186 can comprise a plurality of apertures 188 in fluid communication with a plurality of fluid channels (not shown). Apertures 188 can face a second substrate surface 190 of substrate 176.

Figure 3:
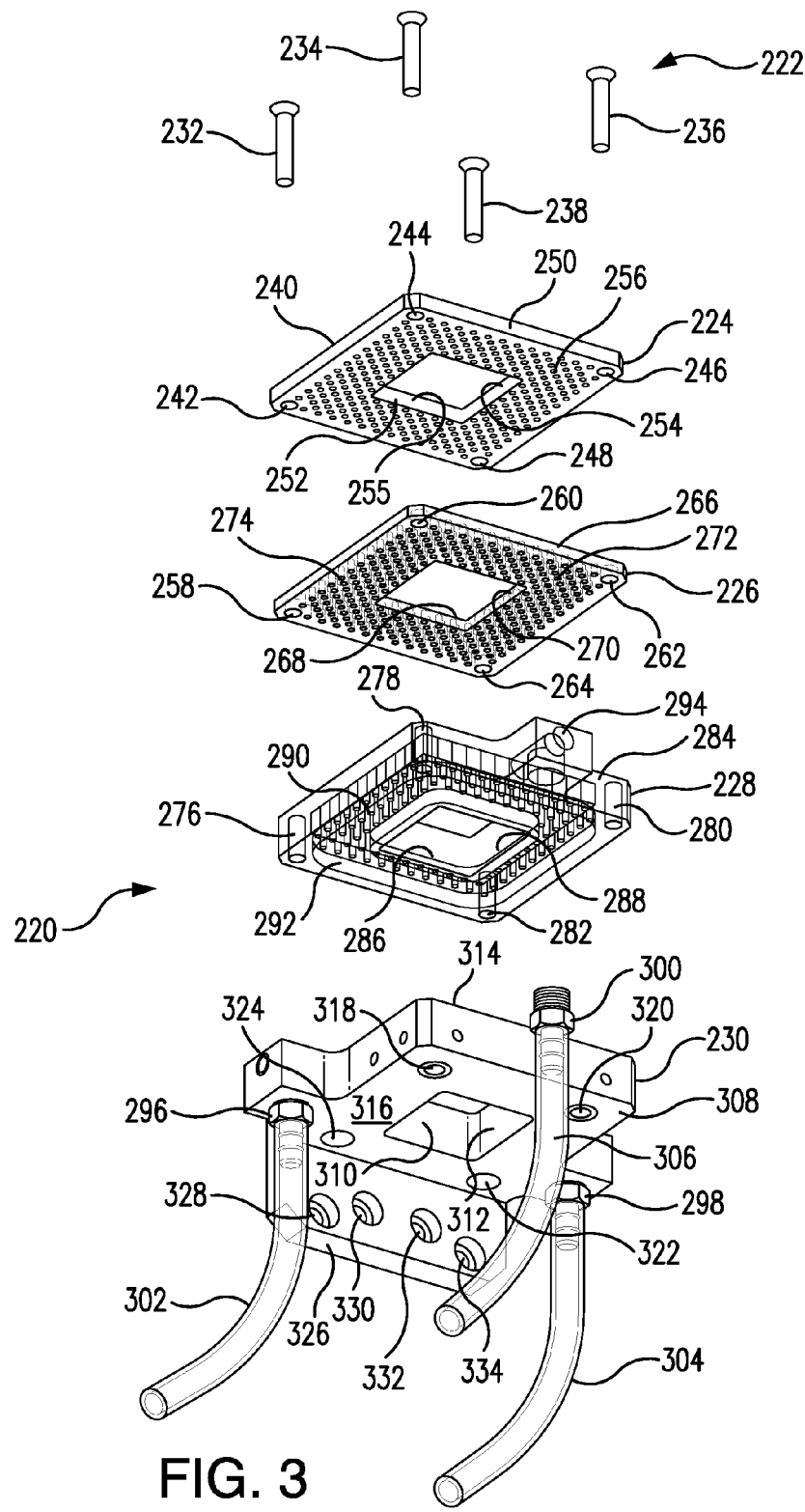
FIG. 3 is a bottom, perspective, exploded view of a gas bearing system in accordance with various embodiments of the present teachings.

FIG. 3 is an exploded view of a gas bearing system 220 in accordance with various embodiments of the present teachings. Gas bearing system 220 can comprise a plurality of fasteners 222 to secure together a face plate 224, a manifold assembly cover 226, a manifold assembly base 228, and a base plate 230. Fasteners 222 can comprise a first fastener 232, a second fastener 234, a third fastener 236, and a fourth fastener 238. Face plate 224 can comprise an end surface 240. End surface 240 can receive fasteners 222. Extending into face plate 224 from end surface 240 can be provided a first fastener hole portion 242, a second fastener hole portion 244, a third fastener hole portion 246, and a fourth fastener hole portion 248. Face plate 224 can comprise an exterior surface 250 and an interior surface 252. Interior surface 252 can define an interior cavity portion 254 as well as a first interior cavity opening 255. A plurality of fluid channel portions 256 can be disposed in face plate 224 between interior surface 252 and exterior surface 250. Each fluid channel portion 256 can terminate at a respective aperture on the end surface of face plate 224 (not shown).

Manifold assembly cover 226 can comprise a first fastener hole portion 258, a second fastener hole portion 260, a third fastener hole portion 262, and a fourth fastener hole portion 264. The fastener hole portions can be disposed between an exterior surface 266 and an interior surface 268 of manifold assembly cover 226. Interior surface 268 can define an interior cavity portion 270. A plurality of fluid channel portions included within a complementary manifold portion 274 can be disposed between interior surface 268 and exterior surface 266.

Manifold assembly base 228 can comprise a first fastener hole portion 276, a second fastener hole portion 278, a third fastener hole portion 280, and a fourth fastener hole portion 282. Fastener hole portions of manifold assembly base 228 can be positioned between exterior surface 284 and interior surface 286 of manifold assembly base 228. Interior surface 286 can define an interior cavity portion 288. Exterior surface 284 and interior surface 286 can also define between them a plurality of fluid channel portions within a complementary manifold portion 292. A port receiving aperture 294 can extend from exterior surface 284.

Base plate 230 can comprise a first port 296, a second port 298, and a third port 300. A first fluid line 302 can be connected to first port 296. A second fluid line 304 can be connected to second port 298. A third fluid line 306 can be connected to third port 300. Face plate 230 can comprise a main base plate portion 308. Main base plate portion 308 can comprise an interior cavity portion 310 as well as a second interior cavity opening 312. An interior base surface 314 can face manifold assembly base 228. An exterior base surface 316 of base plate 230 can face outwardly in a manner similar but opposite to end surface 240 of face plate 224. A plurality of print module package adjustment screw receiving holes can be disposed in exterior base surface 316. These can include first print module package adjustment screw receiving hole 318 and a second print module package adjustment screw receiving hole 320. Other adjustment screw receiving holes can be provided, for example, one for each adjustment screw on a print module package. Base plate 230 can further comprise a flange 326. Flange 326 can be configured for attachment, for example, to an actuator, a robotic arm, a rotating actuator, a support piece, or the like. Flange 326 can comprise a first flange fastener receiving hole 328, a second flange fastener receiving hole 330, a third flange fastener receiving hole 332, and a fourth flange fastener receiving hole 334.

Figure 4:
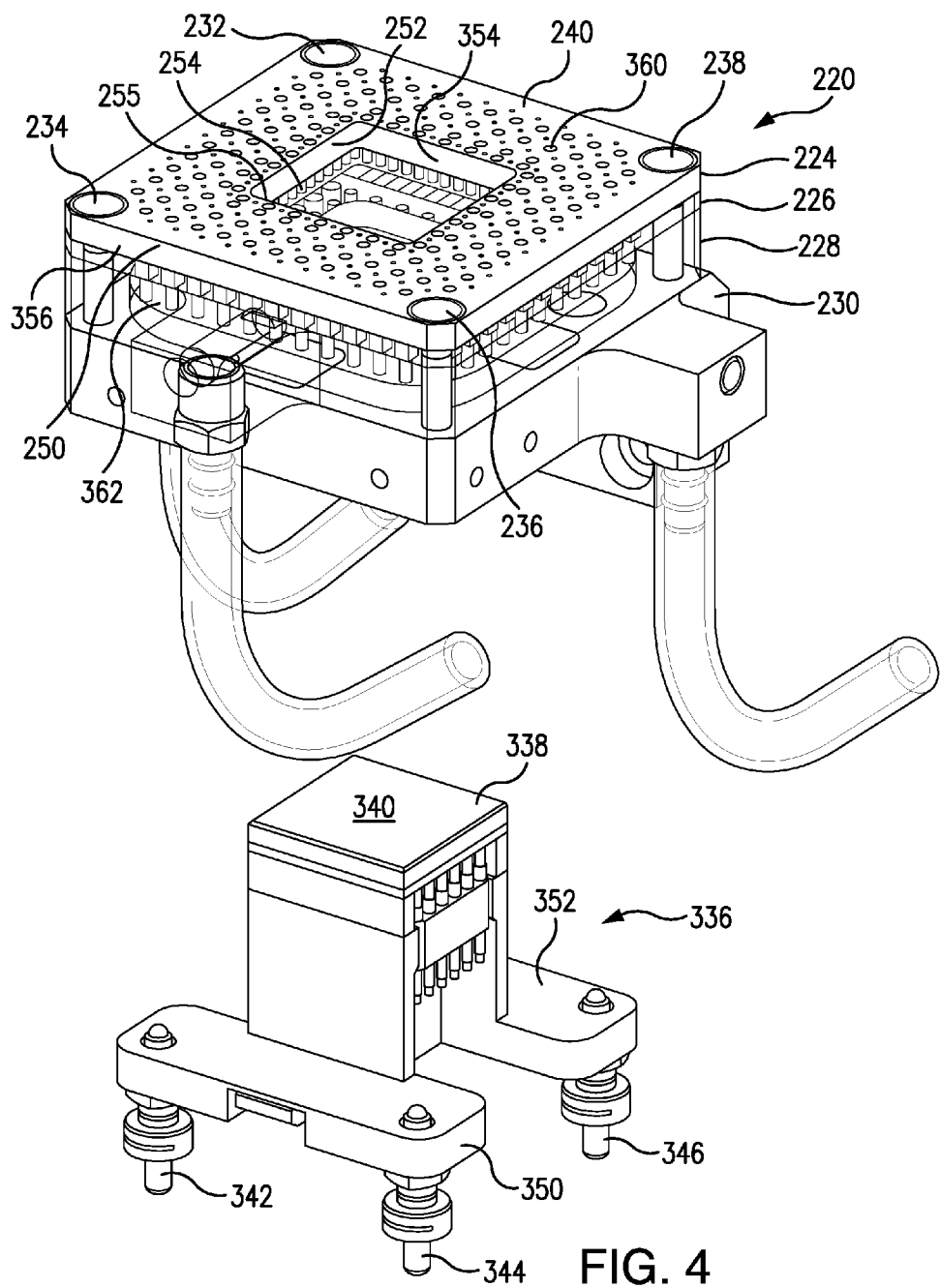
FIG. 4 is a left, bottom, perspective view of the gas bearing system shown in FIG. 3, in an assembled state, and a print module package to be adjustably mounted therein.

FIG. 4 is a left, bottom perspective view of gas bearing system 220 shown assembled and adjacent a print module package 336. First fastener 232, second fastener 234, third fastener 236, and fourth fastener 238 are shown disposed through end surface 240 and secure together face plate 224, manifold assembly cover 226, manifold assembly base 228, and base plate 230. Print module package 336 comprises a printhead 338 as its apex. Printhead 338 can comprise one or more transfer surfaces 340. Print module package 336 can comprise one or more print module package adjustment devices such as linear adjustment screws. FIG. 4 shows a first print module package adjustment screw 342, a second print module package adjustment screw 344, and a third print module package adjustment screw 346. Any number of adjustment screws can be used, for example, three or four. Linear adjustment screws can be used to align the theta x and y rotation of printhead 338 and/or to make transfer surface 340 of printhead 338 flush, recessed, parallel to, and/or slightly extended from end surface 240 of gas bearing system 220. First print module package adjustment screw 342 and second print module package adjustment screw 344 can be secured to, mounted in, and/or adjustably disposed in first print module package base flange 350. Third print module package adjustment screw 346 and one or more other print module package adjustment screws can be secured to, mounted in, and/or adjustably disposed in second print module base flange 352.

Print module package 336 can be fastened to gas bearing system 220 using any of a variety of fasteners. In FIG. 3, two magnets 322 and 324 are shown mounted in the underside of base plate 230. Magnets 322 and 324 can be aligned with corresponding magnets (not shown) on print module package 336 or aligned with a magnetically susceptible metal material that is a part of print module package 336, for example, base flanges 350 and 352 shown in FIG. 4. Any number of magnets can be used.

Interior cavity 354 can result from the assembly of gas bearing system 220 including interior cavity portion 254, interior cavity opening 255, interior cavity portion 288 (FIG. 3), and interior cavity portion 310 (FIG. 3). A plurality of apertures 360 are shown disposed on end surface 240 between exterior surface 250 and interior surface 252. A plurality of manifolds 362 are contained within manifold assembly cover 226 and manifold assembly base 228.

Figure 5:
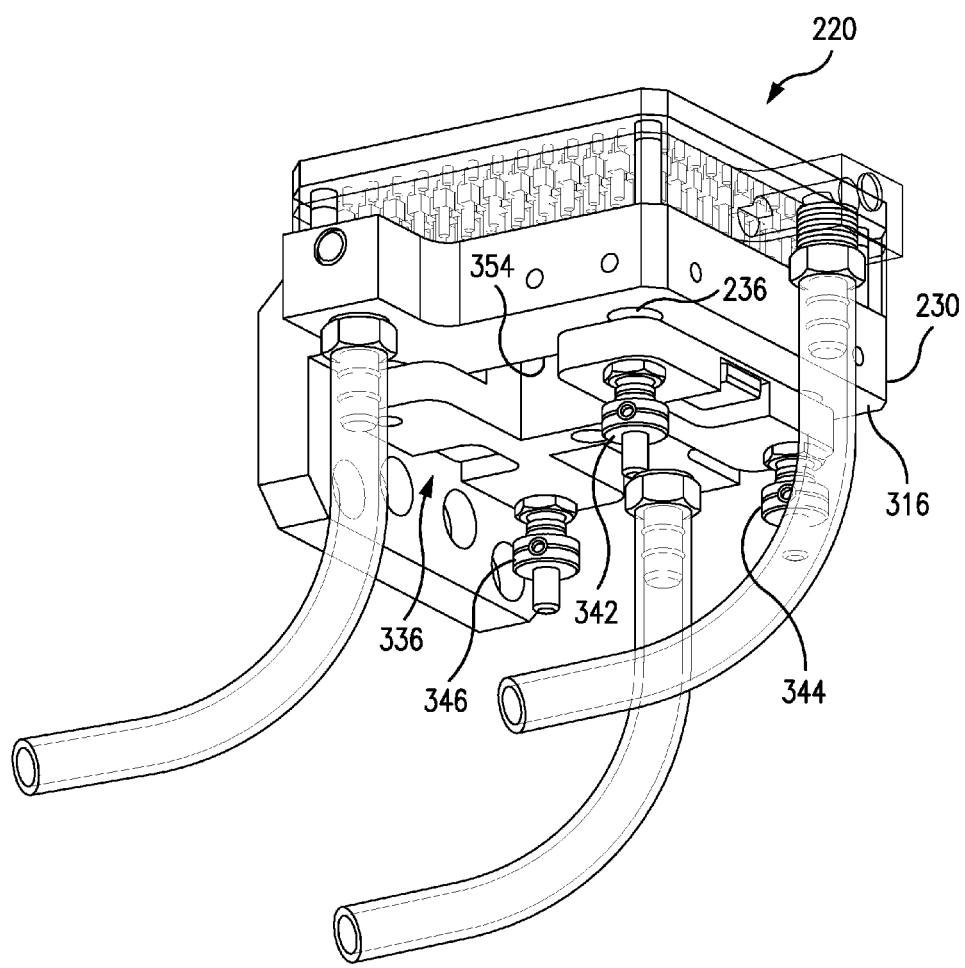
FIG. 5 is a perspective view of the gas bearing system shown in FIG. 3, upside down and in an assembled state, and a print module package adjustably mounted or secured therein.

FIG. 5 is a perspective view of gas bearing system 220 upside down, and assembled with a print module package 336. Print module package 336 has been placed into interior cavity 354 and first print module package adjustment screw 342, second print module package adjustment screw 344, and third print module package adjustment screw 346 are utilized to adjust the relative positioning between print module package 336 and gas bearing system 220. This configuration presses first print module package base flange 350 and second print module package base flange 352 against exterior base surface 316 of base plate 230.

Figure 6:
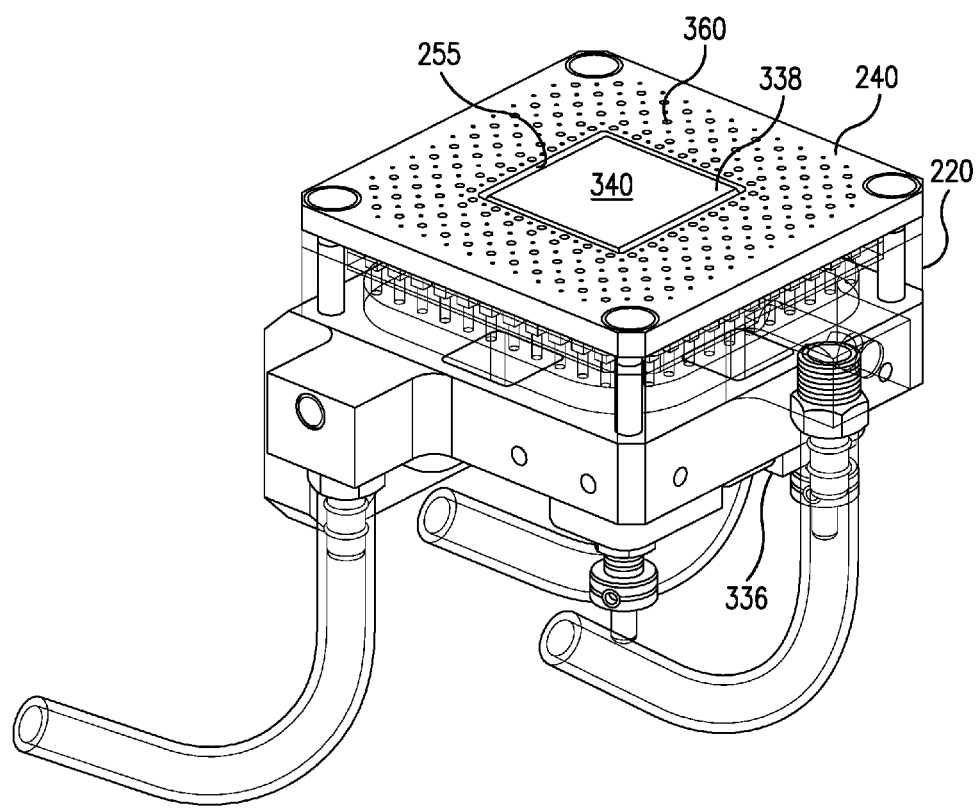
FIG. 6 is a right, bottom perspective view of the gas bearing system and print module package shown in FIG. 5.

FIG. 6 is a right, bottom perspective view of gas bearing system 220 and print module package 336 in an assembled configuration. Printhead 338 and transfer surface 340 are visible through first interior cavity opening 255 and are surrounded by the plurality of apertures 360 disposed on end surface 240.

Figure 7:
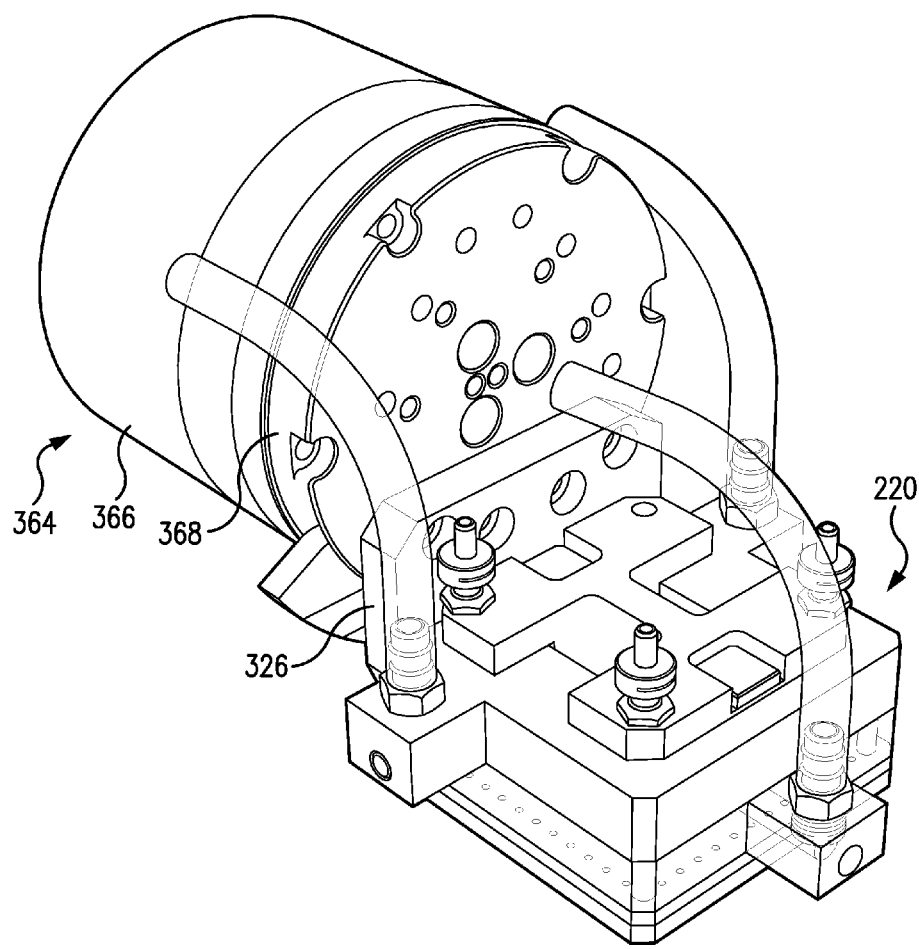
FIG. 7 is a perspective view of the gas bearing system and print module package shown in FIGS. 5 and 6, secured to a rotating actuator and positioned for carrying out a thermal printing operation.

FIG. 7 is a perspective view of gas bearing system 220, connected to an actuator 364 through flange 326. Actuator 364 can comprise an actuator motor 366 and a rotatable actuator faceplate 368. Flange 326 can be secured to actuator face plate 368.

Load-lock features and methods of using them, that can be utilized in accordance with various embodiments of the present teachings, include those described, for example, in U.S. Patent Application Publication No. US 2010/0201749 A1, which is incorporated herein in its entirety by reference.

All publications, patents, and patent applications mentioned in this specification are herein incorporated by reference to the same extent as if each individual publication, patent, or patent application was specifically and individually indicated to be incorporated by reference.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method of printing comprising:
   supporting a substrate with a gas bearing, wherein the gas bearing is in fluid communication with a deposition-printing environment surrounding an enclosed printing system;
   positioning a printhead relative to a first surface of the substrate opposite a second surface of the substrate oriented towards the gas bearing; and
   depositing a film-forming material on the first surface of the substrate while the printhead is positioned relative to the substrate.

2. The method of claim 1, wherein the deposition-printing environment surrounding the printing system is a gas environment.

3. The method of claim 2, wherein the gas environment is a non-oxidizing gas environment.

4. The method of claim 2, wherein the gas environment is an inert gas environment.

5. The method of claim 4, wherein the inert gas environment is provided by nitrogen.

6. The method of claim 4, wherein the inert gas environment is provided by nitrogen in combination with at least one noble gas.

7. The method of claim 4, wherein method further comprises exhausting the gas environment to remove solvent vapors produced from the deposition of the film-forming material.

8. The method of claim 4, wherein the gas environment provides temperature control for the substrate.

9. The method of claim 1, wherein the substrate is a glass substrate.

10. The method of claim 1, wherein the printhead is an inkjet printhead.

11. The method of claim 1, wherein the gas bearing comprises a plurality of pressurized gas channels.

12. The method of claim 1, wherein the gas bearing comprises a plurality of pressurized gas channels and vacuum channels.

13. The method of claim 1, wherein positioning the printhead relative to the first surface of the substrate comprises controlling the print gap between the printhead and the substrate.

14. The method of claim 13, wherein the print gap is controlled to a tolerance of about +/−5 microns.

15. The method of claim 13, wherein the print gap is controlled to a tolerance of about +/−7 microns.

* * * * *